(12) United States Patent
Chen et al.

(10) Patent No.: US 11,226,365 B2
(45) Date of Patent: Jan. 18, 2022

(54) GLITCH DETECTION CIRCUIT

(71) Applicant: NUVOTON TECHNOLOGY CORPORATION, Hsinchu (TW)

(72) Inventors: Po-Sheng Chen, Hsinchu (TW); H. C. Tseng, Hsinchu (TW)

(73) Assignee: Nuvoton Technology Corporation, Hsinchu (TW)

(*) Notice: Subject to any disclaimer, the term of this patent is extended or adjusted under 35 U.S.C. 154(b) by 0 days.

(21) Appl. No.: 17/061,304

(22) Filed: Oct. 1, 2020

(65) Prior Publication Data

US 2021/0247440 A1    Aug. 12, 2021

(30) Foreign Application Priority Data

Feb. 12, 2020   (TW) .................................. 109104385

(51) Int. Cl.
*G01R 31/28*    (2006.01)
(52) U.S. Cl.
CPC ..... *G01R 31/2879* (2013.01); *G01R 31/2894* (2013.01)

(58) Field of Classification Search
CPC .......... G01R 31/31702; G01R 31/2831; G01R 31/2648; G01R 31/2642; G01R 31/26
See application file for complete search history.

(56) References Cited

U.S. PATENT DOCUMENTS

| 2013/0335867 A1* | 12/2013 | Shinde | H03K 19/00361 |
| | | | 361/54 |
| 2017/0279357 A1* | 9/2017 | Tajima | H02M 3/158 |
| 2019/0086473 A1* | 3/2019 | Borrel | G06F 1/28 |

* cited by examiner

*Primary Examiner* — Tung X Nguyen
(74) *Attorney, Agent, or Firm* — Muncy, Geissler, Olds & Lowe, P.C.

(57) ABSTRACT

A glitch detection circuit includes a first P-type field-effect transistor and a second P-type field-effect transistor which are biased by the same current, and a channel width-to-length ratio of the first P-type field-effect transistor is higher than that of the second P-type field-effect transistor. A capacitor having a terminal grounded and another terminal connected to the gates of the first and second P-type field-effect transistors and a power supply terminal. A determination circuit configured to determine that a negative glitch occurs when a voltage decreasing amount of the drain of the first P-type field-effect transistor is greater than that of the second P-type field-effect transistor, and determine that a positive glitch occurs when an voltage increasing amount of the drain of the second P-type field-effect transistor is greater than that of the first P-type field-effect transistor.

10 Claims, 5 Drawing Sheets

GLITCH DETECTION CIRCUIT

CROSS-REFERENCE TO RELATED APPLICATION

This application claims the benefit of Taiwan Patent Application No. 109104385, filed on Feb. 12, 2020, in the Taiwan Intellectual Property Office, the disclosure of which is incorporated herein in its entirety by reference.

BACKGROUND

1. Field

The invention relates to a detection circuit, and more particularly to a glitch detection circuit.

2. Description of the Related Art

Glitch is one of the main causes of damage to electronic circuit parts and ICs. The instantaneous voltage change of the power supply may cause large currents to cause damage or even burnout of the device. It may also cause data stored in the device to be incorrect or the device to reset. When the power supply voltage is stable, the glitch detection circuit is required to have low or no current consumption, and the detection threshold voltage of the glitch detection circuit is not affected by the process and temperature as much as possible to ensure the detection range is consistent. Therefore, it is an important issue in the technical field how to detect low-power consumption and stably detect glitch.

SUMMARY

A purpose of the invention is to provide a glitch detection circuit capable of detecting positive and negative glitches, which has the advantages of low power consumption and is not easily affected by the process and temperature.

In order to achieve the above purpose, an aspect of the invention provides a glitch detection circuit, which comprises a first P-type field effect transistor, a first current source, a second P-type field effect transistor, a second current source, a capacitor and a determination circuit.

The first P-type field effect transistor includes a source electrically coupling to a power supply terminal.

The first current source provides a first bias current to the first P-type field effect transistor, one terminal of the first current source electrically couples to a negative voltage terminal, and another terminal of the first current source electrically couples to a drain of the first P-type field effect transistor.

The second P-type field effect transistor includes a source electrically coupling to the power supply terminal, wherein a channel width-to-length ratio (W/L) of the first P-type field effect transistor is greater than a channel width-to-length ratio (W/L) of the second P-type field effect transistor.

The second current source provides a second bias current to the second P-type field effect transistor, a terminal of the second current source electrically couples to the negative voltage terminal, and another terminal of the second current source electrically couples to a drain of the second P-type field effect transistor.

One terminal of the capacitor electrically couples to the negative voltage terminal, and the other terminal of the capacitor electrically couples to a gate of the first P-type field effect transistor and a gate of the second P-type field effect transistor and the power supply terminal.

The determination circuit determines that the power supply terminal occurs a negative glitch when the voltage decreasing amount of the drain of the first P-type field effect transistor is greater than the voltage decreasing amount of the drain of the second P-type field effect transistor, the determination circuit determines that the power supply terminal occurs a positive glitch when the voltage increasing amount of the drain of the second P-type field effect transistor is greater than the voltage increasing amount of the drain of the first P-type field effect transistor.

According to an embodiment of the invention, the voltage of the drain of the first P-type field effect transistor is higher than the voltage of the drain of the second P-type field effect transistor when the power supply terminal is under a normal state.

According to an embodiment of the invention, the first current source and the second current source are implemented by a current mirror circuit, the current mirror circuit comprising a first N-type field effect transistor and a second N-type field effect transistor.

The first N-type field effect transistor is connected in series between the drain of the first P-type field effect transistor and the negative voltage terminal.

The second N-type field effect transistor is connected in series between the drain of the second P-type field effect transistor and the negative voltage terminal, wherein the channel width-to-length ratio (W/L) of the first N-type field effect transistor is equal to the channel width-to-length ratio (W/L) of the second N-type field effect transistor.

According to an embodiment of the invention, the determination circuit comprises a first inverter and a second inverter.

An input terminal of the first inverter couples to the drain of the first P-type field effect transistor.

An input terminal of the second inverter couples to the drain of the second P-type field effect transistor, when a voltage of an output terminal of the first inverter increases, the negative glitch occurs at the power supply terminal, when a voltage of an output terminal of the second inverter decreases, the positive glitch occurs at the power supply terminal.

According to an embodiment of the invention, the determination circuit comprises a first comparator and a second comparator.

The first comparator is used for comparing a voltage of the drain of the first P-type field effect transistor and a first reference voltage.

The second comparator is used for comparing a voltage of the drain of the second P-type field effect transistor and a second reference voltage, when an output signal of the first comparator indicates that a voltage of the drain of first P-type field effect transistor is lower than the first reference voltage, the determination circuit determines that the power supply terminal occurs the negative glitch, when an output signal of the second comparator indicates that a voltage of the drain of second P-type field effect transistor is greater than the second reference voltage, the determination circuit determines that the power supply terminal occurs the positive glitch.

In order to achieve the above purpose, an aspect of the invention provides a glitch detection circuit, which comprises a P-type field effect transistor, a capacitor, a current mirror circuit and a determination circuit.

The P-type field effect transistor includes a source electrically coupling to a power supply terminal.

One terminal of the capacitor electrically couples to a negative voltage terminal, and the other terminal of the capacitor electrically couples to a gate of the P-type field effect transistor and a power supply terminal.

The current mirror circuit provides a first bias current to the P-type field effect transistor, the current mirror circuit includes an N-type field effect transistor, the N-type field effect transistor is connecting in series between a drain of the P-type field effect transistor and the negative voltage terminal, wherein an on-resistance of the P-type field effect transistor is lower than an on-resistance of the N-type field effect transistor when the power supply terminal is under a normal state.

The determination circuit determines that the power supply terminal occurs a negative glitch when a voltage of the drain of the P-type field effect transistor decreases.

According to an embodiment of the invention, the determination circuit includes an inverter, an input terminal of the inverter couples to the drain of the P-type field effect transistor, when a voltage of an output terminal of the inverter increases, the power supply terminal occurs the negative glitch.

In order to achieve the above purpose, an aspect of the invention provides a glitch detection circuit, which comprises a P-type field effect transistor, a capacitor, a current mirror circuit and a determination circuit.

The P-type field effect transistor includes a source electrically coupling to a power supply terminal.

One terminal of the capacitor electrically couples to a negative voltage terminal, and the other terminal of the capacitor electrically couples to a gate of the P-type field effect transistor and a power supply terminal.

The current mirror circuit provides a first bias current to the P-type field effect transistor, the current mirror circuit includes an N-type field effect transistor, the N-type field effect transistor is connecting in series between a drain of the P-type field effect transistor and the negative voltage terminal, wherein an on-resistance of the P-type field effect transistor is greater than an on-resistance of the N-type field effect transistor when the power supply terminal is under a normal state.

The determination circuit determines that the power supply terminal occurs a positive glitch when a voltage of the drain of the P-type field effect transistor increases.

According to an embodiment of the invention, the determination circuit includes an inverter, an input terminal of the inverter couples to the drain of the P-type field effect transistor, when a voltage of an output terminal of the inverter decreases, the power supply terminal occurs the positive glitch.

In order to achieve the above purpose, an aspect of the invention provides a glitch detection circuit, which comprises a current mirror circuit, a first P-type field effect transistor, a second P-type field effect transistor, a third P-type field effect transistor, a capacitor and a determination circuit.

The current mirror circuit comprises a first N-type field effect transistor, a second N-type field effect transistor, a third N-type field effect transistor and a fourth N-type field effect transistor.

wherein the sources of the first N-type field effect transistor, the second N-type field effect transistor, the third N-type field effect transistor and the fourth N-type field effect transistor electrically couple to a negative voltage terminal.

wherein the gates of the first N-type field effect transistor, the second N-type field effect transistor, the third N-type field effect transistor and the fourth N-type field effect transistor electrically couple to the drain of the fourth N-type field effect transistor.

wherein the drain of the fourth N-type field effect transistor receives a reference current, and a first current flowing through the drain of the first N-type field effect transistor is mirrored from the reference current, and a second current flowing through the drain of the second N-type field effect transistor is mirrored from the reference current, and a third current flowing through the drain of the third N-type field effect transistor is mirrored from the reference current.

The first P-type field effect transistor includes a source electrically coupling to a power supply terminal, and a drain of the first P-type field effect transistor is electrically coupled to the drain of the first N-type field effect transistor.

The second P-type field effect transistor includes a source electrically coupling to the power supply terminal, and a drain of the second P-type field effect transistor is electrically coupled to the drain of the second N-type field effect transistor.

The third P-type field effect transistor includes a source electrically coupling to the power supply terminal, and a drain of the third P-type field effect transistor is electrically coupled to the drain of the third N-type field effect transistor.

One terminal of the capacitor is electrically coupled to the negative voltage terminal, and the other terminal of the capacitor is electrically coupled to a gate of the first P-type field effect transistor, and a gate of the second P-type field effect transistor, and a gate and the drain of the third P-type field effect transistor.

The determination circuit determines that the power supply terminal occurs a negative glitch when the voltage decreasing amount of the drain of the first P-type field effect transistor is greater than the voltage decreasing amount of the drain of the second P-type field effect transistor, the determination circuit determines that the power supply terminal occurs a positive glitch when the voltage increasing amount of the drain of the second P-type field effect transistor is greater than the voltage increasing amount of the drain of the first P-type field effect transistor.

DETAILED DESCRIPTION

The embodiment of the invention will be described below in detail with reference to the drawings and examples, so as to fully understand the implementation process of how the invention applies technical means to solve technical problems and achieve technical effects and enablement.

Figure 1:
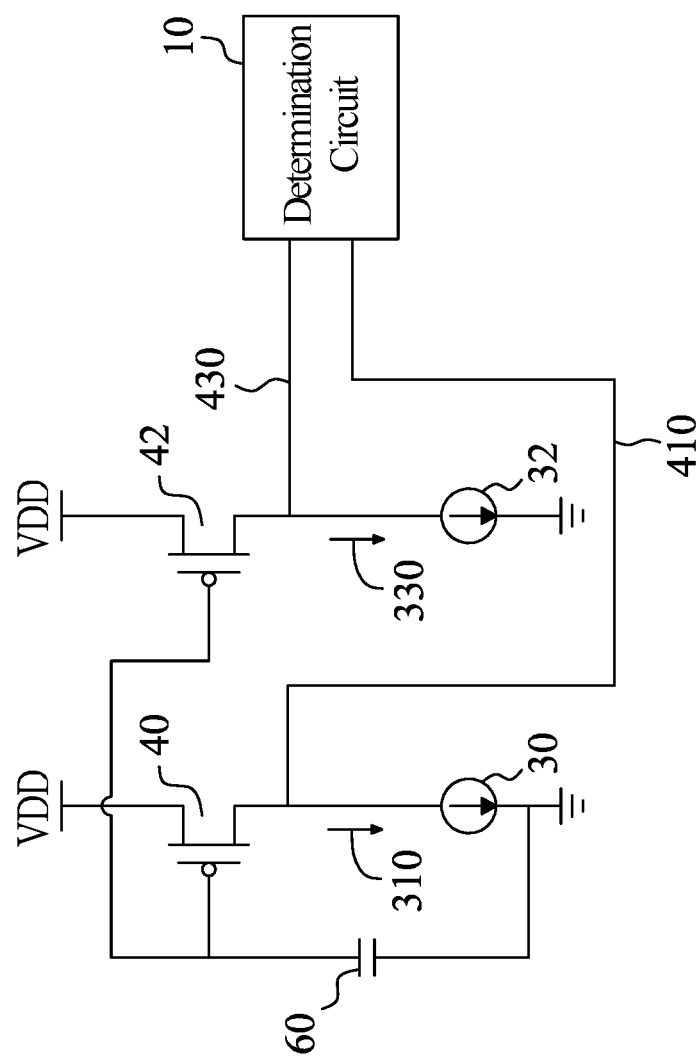
FIG. 1 is a simple circuit diagram of a glitch detection circuit according to a first embodiment of the invention.

FIG. 1 is a simple circuit diagram of a glitch detection circuit according to a first embodiment of the invention. As shown in FIG. 1, the glitch detection circuit comprises a first P-type field effect transistor 40, a first current source 30, a second P-type field effect transistor 42, a second current source 32, a capacitor 60 and a determination circuit 10.

The source of the first P-type field effect transistor 40 is electrically coupled to the power supply terminal VDD. The first current source 30 provides a first bias current 310 flowing from the source of the first P-type field effect transistor 40 to the drain of the first P-type field effect transistor 40 for biasing the first P-type field effect transistor 40. One terminal of the first current source 30 is electrically coupled to a negative voltage terminal (the ground terminal in this embodiment), and another terminal is electrically coupled to the drain of the first P-type field effect transistor 40.

The source of the second P-type field effect transistor 42 is electrically coupled to the power supply terminal VDD. The second current source 32 provides a second bias current 330 flowing from the source of the second P-type field effect transistor 42 to the drain of the second P-type field effect transistor 42 for biasing the second P-type field effect transistor 42. One terminal of the second current source 32 is electrically coupled to the negative voltage terminal (the ground terminal in this embodiment), and another terminal is electrically coupled to the drain of the second P-type field effect transistor 42.

One terminal (for example, the bottom terminal) of the capacitor 60 is electrically coupled to the negative voltage terminal (the ground terminal in this embodiment), and the other terminal (for example, the top terminal) of the capacitor 60 is electrically coupled to a gate of the first P-type field effect transistor 40 and a gate of the second P-type field effect transistor 42. When the glitch detection circuit is in operation, the capacitor 60 can be pre-charged to preserve the voltage of said the other terminal of the capacitor 60 at a predetermined voltage.

For example, the other terminal of the capacitor 60 can be connected to a switch, before the glitch detection circuit operates, the switch is turned on, the capacitor 60 is charged so that the voltage at the other terminal of the capacitor 60 reached a predetermined voltage, for example, a voltage lower than the voltage of the power supply terminal VDD by the threshold voltages of the transistors 40 and the transistors 42.

For example, when VDD is 5V, the predetermined voltage can be lower than 4.3V. When the glitch detection circuit starts to operate, the switch is turned off, so that the voltage at the other terminal of the capacitor 60 is preserved at the above-mentioned predetermined voltage without being affected by the change of the power supply VDD voltage.

The channel width-to-length ratio (W/L) of the first P-type field effect transistor 40 is greater than the channel width-to-length ratio of the second P-type field effect transistor 42, so the on-resistance of the first P-type field effect transistor 40 is lower than the on-resistance of the second P-type field effect transistor.

In practical applications, the channel width-to-length ratio (W/L) of the first P-type field effect transistor 40 can be designed to be greater than the channel width-to-length ratio of the second P-type field effect transistor 42 more than 10 times, so that the on-resistance of the first P-type field effect transistor 40 is much lower than the on-resistance of the second P-type field effect transistor 42.

According to the voltage divider rule, the voltage across the device is proportional to the resistance. Therefore, when the voltage of the power supply terminal VDD is under a normal state, the voltage across the first P-type field effect transistor 40 is low and the voltage across the second P-type field effect transistor 422 is large, the voltage 410 of the drain of the first P-type field effect transistor 40 is greater than the voltage 430 of the drain of the second P-type field effect transistor 42. For example, the voltage 410 of the drain of the first P-type field effect transistor 40 is more close to the voltage of the power supply terminal VDD, and the voltage 430 of the drain of the second P-type field effect transistor 42 is more close to 0V.

The determination circuit 10 receives and compares the voltages 410 and 430, and determines whether a positive glitch or a negative glitch occurs at the power supply terminal VDD according to the changes of the voltages 410 and 430. For example, when a positive glitch occurs at the power supply terminal VDD, since the voltage of the capacitor 60 cannot be changed instantaneously, when a positive glitch occurs, the voltages of the gates of the first P-type field effect transistor 40 and the second P-type field effect transistor 42 are temporarily the voltages on the top terminal of the capacitor 60, and the voltages of the source of the first P-type field effect transistor 40 and the source of the second P-type field effect transistor 42 follows the positive glitch as the voltages increase, the source-to-gate voltage of the first P-type field effect transistor 40 and the source-to-gate voltage of the second P-type field effect transistor 42 both increase, resulting in the on-resistance of the first P-type field effect transistor 40 and the on-resistance of the second P-type field effect transistor 42 will both become smaller.

The on-resistance of the first P-type field effect transistor 40 is much lower than the on-resistance of the second P-type field effect transistor 42 when the voltage of the power supply terminal VDD is under a normal state, when a positive glitch occurs on the power supply terminal VDD to causes the on-resistance of the first P-type field effect transistor 40 and the on-resistance of the second P-type field effect transistor 42 to become slower, the magnitude of change in the on-resistance of the second P-type field effect transistor 42 will be greater than the magnitude of change of the on-resistance of the first P-type field effect transistor 40, so that the voltage of the drain of the second P-type field effect transistor 42 will increase from close to 0V to the voltage close to the voltage of the power supply terminal VDD, and the voltage of the drain of the first P-type field effect transistor 40 is still close to the voltage of the power supply terminal VDD.

Therefore, when the rising magnitude of the voltage of the drain of the second P-type field effect transistor 42 is greater than that of the first P-type field effect transistor 40, the determination circuit 10 can determine that a positive glitch occurs at the power supply terminal VDD.

Similarly, when a negative glitch occurs at the power supply terminal VDD, since the voltage of the capacitor 60 cannot be converted instantaneously, the source-to-gate voltage of the first P-type field effect transistor 40 and the source-to-gate voltage of the second P-type field effect transistors 42 will become lower, it causes the on-resistance of the first P-type field effect transistor 40 and the on-resistance of the second P-type field effect transistor 42 becoming greater.

Since the voltage of the power supply terminal VDD is under a normal state, the on-resistance of the second P-type field effect transistor 42 will be much greater than that of the first P-type field effect transistor 40, when a negative glitch occurs at the power supply terminal VDD, the on-resistance of the first P-type field effect transistor 40 and the on-resistance of the second P-type field effect transistor 42 both become greater, the changing magnitude of the on-resistance of the first P-type field effect transistor 40 is greater than that of the second P-type field effect transistors 42.

For example, the voltage of the drain of the first P-type field effect transistor 40 decreases from the voltage close to the power supply terminal VDD to close to 0V, while the voltage of the drain of the second P-type field effect transistor 42 is still close to 0V. Therefore, when the dropping magnitude of the voltage of the drain of the first P-type field effect transistor 40 is greater than that of the drain of the second P-type field effect transistor 42, the determination circuit 10 can determine that the power supply terminal VDD appears a negative glitch.

In an embodiment, the first current source 30 and the second current source 32 can be implemented by a current mirror circuit 20. The determination circuit 10 can be implemented by at least one inverter or at least one comparator. It will be described in detail in the following paragraphs.

Figure 2:
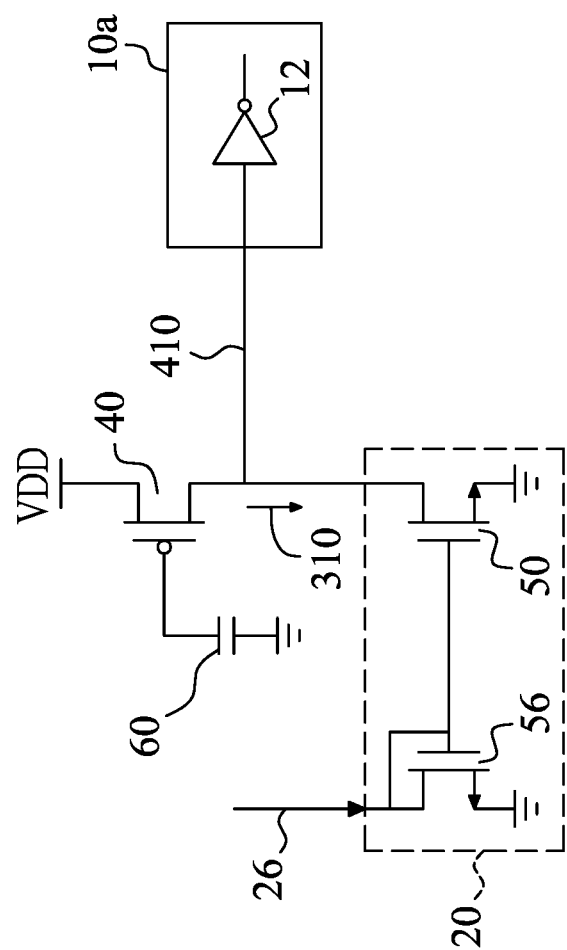
FIG. 2 is a simple circuit diagram of a glitch detection circuit according to a second embodiment of the invention.

FIG. 2 is a simple circuit diagram of a glitch detection circuit according to a second embodiment of the invention. As shown in FIG. 2, in the second embodiment, the glitch detection circuit includes a first P-type field effect transistor 40, a capacitor 60, a current mirror circuit 20, and a determination circuit 10a.

The source of the first P-type field effect transistor 40 is electrically coupled to the power supply terminal VDD. One terminal of the capacitor 60 is electrically coupled to a negative voltage terminal (in this embodiment, a ground terminal), and the other terminal is electrically coupled to the gate of the first P-type field effect transistor 40. When the glitch detection circuit operates, the capacitor 60 can be pre-charged to preserve the voltage across the capacitor 60 at a predetermined voltage. In this embodiment, the method for pre-charging the capacitor 60 has been described above, so it will not be repeated here.

The current mirror circuit 20 provides a first bias current 310 to the first P-type field effect transistor 40 to bias the first P-type field effect transistor 40. The current mirror circuit 20 may include a first N-type field effect transistor 50 and a fourth N-type field effect transistor 56, the first N-type field effect transistor 50 is serially connected between the drain and the ground terminal of the first P-type field effect transistor 40. The gate of the fourth N-type field effect transistor 56 is electrically coupled to the gate of the first N-type field effect transistor 50 and the drain of the fourth N-type field effect transistor 56. The drain of the fourth N-type field effect transistor 56 receives a reference current 26, and the current mirror circuit 20 is used for mirroring the reference current 26 to generate a bias current 310.

When the power supply terminal VDD is under a normal state, the on-resistance of the first P-type field effect transistor 40 is lower than the on-resistance of the first N-type field effect transistor 50. For example, the channel width-to-length ratio (W/L) of first P-type field effect transistor 40 can be designed to be greater than the channel width-to-length ratio (W/L) of the first N-type field effect transistor 50, for example, more than 10 times.

According to the voltage divider rule, the voltage across device will be proportional to the resistance, when the voltage of the power supply terminal VDD is under a normal state, the voltage across the first P-type field effect transistor 40 is lower than the voltage across the first N-type field effect transistor 50, that is, the voltage 410 of the drain of the first P-type field effect transistor 40 will be more close to the voltage of the power supply terminal VDD.

When a negative glitch occurs at the power supply terminal VDD, since the voltage of the capacitor 60 cannot be converted instantaneously, the source-to-gate voltage of the first P-type field effect transistor 40 becomes smaller, the on-resistance of the first P-type field effect transistor 40 becomes larger, that is, the voltage across the first P-type field effect transistor 40 becomes larger, it causes the voltage 410 of the drain of the first P-type field effect transistor 40 to decrease. Therefore, when it is detected that the voltage 410 of the drain of the first P-type field effect transistor 40 decreases, the determination circuit 10a can determine that a negative glitch occurs at the power supply terminal VDD.

In the second embodiment, the determination circuit 10a may include a first inverter 12 whose input terminal is coupled to the drain of the first P-type field effect transistor 40. When the voltage of the power supply terminal VDD is under a normal state, the voltage 410 of the drain of the first P-type field effect transistor 40 will be more close to the voltage of the power supply terminal VDD, so the voltage of one output terminal of the first inverter 12 is under low level voltage, that is, 0V. When a negative glitch occurs at the power supply terminal VDD, the voltage 410 of the drain of the first P-type field effect transistor 40 will decrease, the voltage at the output terminal of the first inverter 12 converts from the low level voltage to a high level voltage, indicating that a negative glitch occurs at the power supply terminal VDD.

Figure 3:
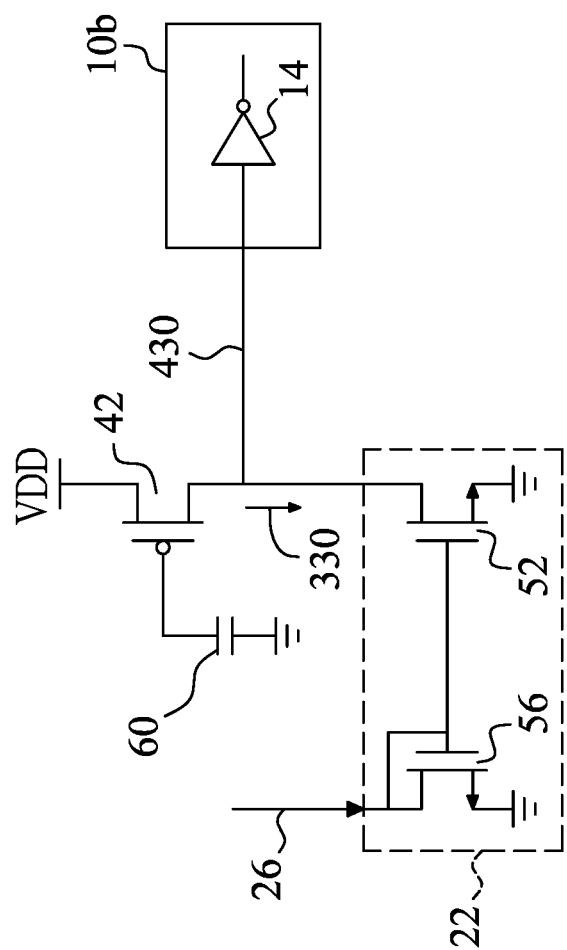
FIG. 3 is a simple circuit diagram of a glitch detection circuit according to a third embodiment of the invention.

FIG. 3 is a simple circuit diagram of a glitch detection circuit according to a third embodiment of the invention. As shown in FIG. 3, in the third embodiment, the glitch detection circuit includes a second P-type field effect transistor 42, a capacitor 60, a current mirror circuit 22, and a determination circuit 10b. The source of the second P-type field effect transistor 42 is electrically coupled to the power supply terminal VDD. One terminal of the capacitor 60 is electrically coupled to a negative voltage terminal (the ground terminal in this embodiment), and the other terminal of the capacitor 60 is electrically coupled to the gate of the second P-type field effect transistor 42.

When the glitch detection circuit operates, the capacitor 60 can be pre-charged to preserve the voltage across the capacitor 60 at a predetermined voltage. In this embodiment, the method for pre-charging the capacitor 60 has been described above, so it will not be repeated here.

The current mirror circuit 22 provides a second bias current 330 to the second P-type field effect transistor 42 to bias the second P-type field effect transistor 42. The current mirror circuit 22 includes a second N-type field effect transistor 52 and a fourth N-type field effect transistor 56. The second N-type field effect transistor 52 is coupled in series between the drain of the second P-type field effect transistor 42 and the ground terminal. The gate of the fourth N-type field effect transistor 56 is electrically coupled to the gate of the second N-type field effect transistor 52 and the drain of the fourth N-type field effect transistor 56. The drain of the fourth N-type field effect transistor 56 receives a reference current 26, and the current mirror circuit 22 is used for mirroring the reference current 26 to generate a bias current 330.

When the power supply terminal VDD is under a normal state, the on-resistance of the second P-type field effect transistor 42 is greater than the on-resistance of the second N-type field effect transistor 52. For example, the channel width-to-length ratio (W/L) of the second P-type field effect transistor 42 can be designed to be smaller than the channel width-to-length ratio (W/L) of the second N-type field effect transistor 52, for example, lower than 10 times.

According to the voltage divider rule, the voltage across device is proportional to the resistance. Therefore, when the voltage of the power supply terminal VDD is under a normal state, the voltage across the second P-type field effect transistor 42 is greater than the voltage across the second N-type field effect transistor 52, the voltage 430 of the drain of the second P-type field effect transistor 42 will be more close to the voltage of the ground terminal, that is, 0V.

When a positive glitch occurs at the power supply terminal VDD, the voltage of the capacitor 60 cannot be converted instantaneously, the source-to-gate voltage of the second P-type field effect transistor 42 becomes greater, the on-resistance of the second P-type field effect transistor 42 becomes smaller, that is, the voltage across the second P-type field effect transistor 42 becomes smaller, it causes the voltage 430 of the drain of the second P-type field effect transistor 42 to increase. Therefore, when it is detected that the voltage 430 of the drain of the second P-type field effect transistor 42 increases, the determination circuit 10b can determine that a positive glitch occurs at the power supply terminal VDD.

In the third embodiment, the determination circuit 10b may include an inverter 14 whose input terminal is coupled to the drain of the second P-type field effect transistor 42. When the voltage of the power supply terminal VDD is under a normal state, the voltage 410 of the drain of the second P-type field effect transistor 42 will be more close to the voltage of the ground terminal, that is, 0V, the voltage of one output terminal of the inverter 14 is a high level voltage, such as the voltage of the power supply terminal VDD.

When a positive glitch occurs at the power supply terminal VDD, the voltage 410 of the drain of the second P-type field effect transistor 42 will increase, the voltage at the output terminal of the inverter 14 converts from a high level voltage to a low level voltage, indicating that a positive glitch occurs at the power supply terminal VDD.

Figure 4:
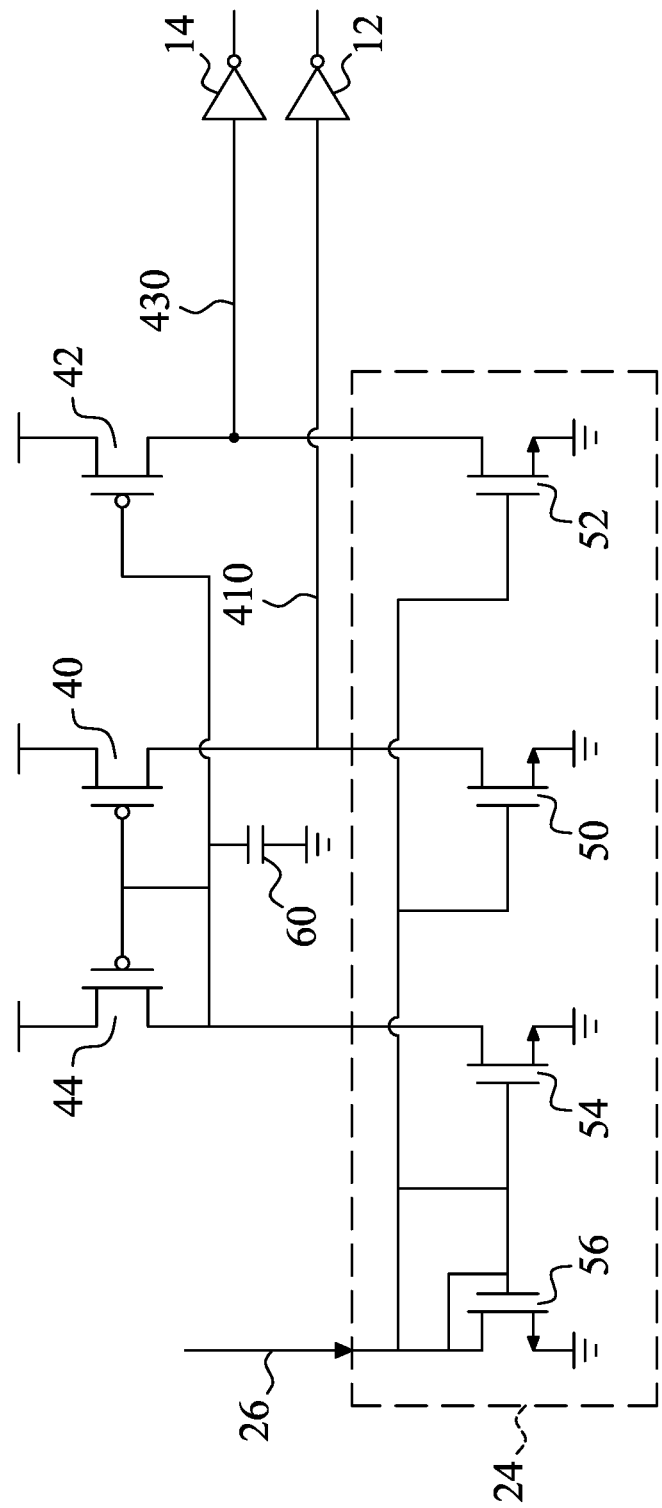
FIG. 4 is a simple circuit diagram of a glitch detection circuit according to a fourth embodiment of the invention.

FIG. 4 is a simple circuit diagram of a glitch detection circuit according to a fourth embodiment of the invention. As shown in FIG. 4, the glitch detection circuit includes a current mirror circuit 24, a first P-type field effect transistor 40, a second P-type field effect transistor 42, a third P-type field effect transistor 44, a capacitor 60 and a determination circuit. The current mirror circuit 24 includes a first N-type field effect transistor 50, a second N-type field effect transistor 52, a third N-type field effect transistor 54 and a fourth N-type field effect transistor 56. The sources of the first N-type field effect transistor 50, the second N-type field effect transistor 52, the third N-type field effect transistor 54 and the fourth N-type field effect transistor 56 are electrically coupled to a negative voltage terminal. In this embodiment, the negative voltage terminal is the ground terminal.

The gates of the first N-type field effect transistor 50, the second N-type field effect transistor 52, the third N-type field effect transistor 54 and the fourth N-type field effect transistor 56 are electrically coupled to the drain of the fourth N-type field effect transistor 56, and the drain of the fourth N-type field effect transistor 56 receives a reference current 26. The current mirror circuit 24 mirrors a first current, a second current, and a third current according to the reference current 26, the first current is used for biasing the first N-type field effect transistor 50, the second current is used for biasing the second N-type field effect transistor 52, the third current are used for biasing the third N-type field effect transistor 54.

The source of the first P-type field effect transistor 40 is electrically coupled to the power supply terminal VDD, and the drain of the first P-type field effect transistor 40 is electrically coupled to the drain of the first N-type field effect transistor 50. The source of the second P-type field effect transistor 42 is electrically coupled to the power supply terminal VDD, and the drain of the second P-type field effect transistor 42 is electrically coupled to the drain of the second N-type field effect transistor 52. The source of the third P-type field effect transistor 44 is electrically coupled to the power supply terminal VDD, and the drain of the third P-type field effect transistor 44 is electrically coupled to the drain of the third N-type field effect transistor 54.

One terminal of the capacitor 60 is electrically coupled to the ground terminal, and the other terminal of the capacitor 60 is electrically coupled to the gate of the first P-type field effect transistor 40, the gate of the second P-type field effect transistor 42 and the gate and drain of the third P-type field effect transistor 44. When the glitch detection circuit is operated, the third P-type field effect transistor 44 is under on-state, the voltage on said the other terminal of the capacitor 60 can be preserved at the voltage of the power supply terminal VDD.

In this embodiment, the determination circuit includes a first inverter 12 and a second inverter 14, the input of the first inverter 12 is electrically coupled to the drain of the first P-type field effect transistor 40, the input terminal of the second inverter 14 is electrically coupled to the drain electrode of the second P-type field effect transistor 42.

In this embodiment, the channel width-to-length ratios (W/L) of the first N-type field effect transistor 50, the second N-type field effect transistor 52, the third N-type field effect transistor 54, and the fourth N-type field effect transistor 56 are the same. The ratio of the channel width-to-length ratio of the third P-type field effect transistor 44 and the channel width-to-length ratio of the first P-type field effect transistor 40 is 1:M, and M is a value greater than 1.

The ratio of the channel width-to-length ratio of the third P-type field effect transistor 44 and the channel width-to-length ratio of the second P-type field effect transistor 42 is 1:K, and K is a value lower than 1. Therefore, the channel width-to-length ratio of the first P-type field effect transistor 40 is greater than the channel width-to-length ratio of the second P-type field effect transistor 42. For example, the channel width-to-length ratio of the first P-type field effect transistor 40 is ten times more than the channel width-to-length ratio of the second P-type field effect transistor 42. In an embodiment, the channel width-to-length ratio of the third P-type field effect transistor 44 may be equal to the channel width-to-length ratio of the third N-type field effect transistor 54. However, the invention is not limited thereto.

The same principle as the foregoing, since the on-resistance of the first P-type field effect transistor 40 is much lower than the on-resistance of the second P-type field effect transistor 42, the voltage of the power supply terminal VDD is under a normal state, the voltage of the drain of the first P-type field effect transistor 40 is close to the voltage of the power supply terminal VDD, which is a high level voltage, and the voltage of the drain of the second P-type field effect transistor 42 is close to 0V, which is a low level voltage. Therefore, the output terminal of the first inverter 12 outputs a low level voltage, and the output terminal of the inverter 14 outputs a high level voltage.

When the dropping magnitude of the voltage of the drain of the first P-type field effect transistor 40 is greater than that of the voltage of the drain of the second P-type field effect transistor 42, the voltage of the output terminal of the first inverter 12 is converted from low level voltage to high level voltage, and the voltage of the output terminal of the inverter 14 does not change, it can determine that a negative glitch occurs at the power supply terminal VDD.

When the rising magnitude of the voltage of the drain of the second P-type field effect transistor is greater than that of the voltage of the drain of the first P-type field effect transistor, the output terminal of the inverter 14 is converted from high level voltage to low level voltage, and the voltage of the output terminal of the first inverter 12 does not change, it can determine that a positive glitch occurs at the power supply terminal VDD.

Figure 5:
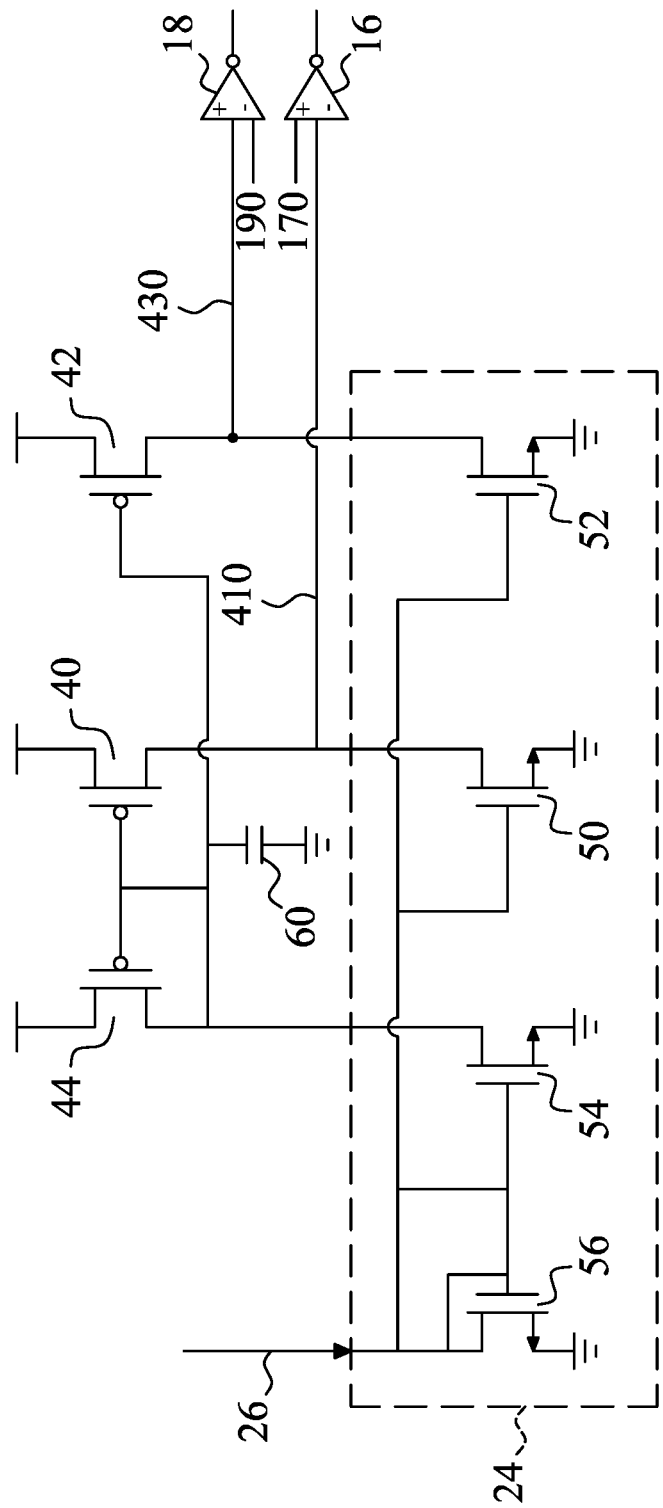
FIG. 5 is a simple circuit diagram of a glitch detection circuit according to a fifth embodiment of the invention.

FIG. 5 is a simple circuit diagram of a glitch detection circuit according to a fifth embodiment of the invention. The fifth embodiment is similar to the fourth embodiment, and the difference between the fifth embodiment and the fourth embodiment is that the fifth embodiment uses two comparators to implement the determination circuit.

The determination circuit of the fifth embodiment includes a first comparator 16 and a second comparator 18. The first comparator 16 is used for comparing the voltage 410 of the drain of the first P-type field effect transistor 40 with a first reference voltage 170, and the second comparator 18 is used for comparing the voltage 430 of the drain of the second P-type field effect transistor 42 with a second reference voltage 190.

When the voltage of the power supply terminal VDD is under a normal state, the voltage 410 of the drain of the first P-type field effect transistor 40 is greater than the first reference voltage 170, and the voltage 430 of the drain of the second P-type field effect transistor 42 is lower than the second reference voltage 190.

When the output signal of the first comparator 16 indicates that the voltage 410 of the drain of the first P-type field effect transistor 40 is lower than the first reference voltage 170, it can determine that a negative glitch occurs at the power supply terminal VDD, when output signal of the second comparator 18 indicates that the voltage 430 of the drain of the second P-type field effect transistor 42 is greater than the second reference voltage 190, and it can determine that a positive glitch occurs at the power supply terminal VDD.

It should be noted that, in an embodiment, the current source of the invention, such as the first current source 30 or the second current source 32 can be implemented with an adjustable current source, whereby the response sensitivity of the glitch detection circuit of the invention corresponding to voltage changes with different slopes (voltage change/ time) on the power supply terminal can be adjusted.

In an embodiment, the capacitor 60 of the invention can be implemented with a varactor, whereby the response sensitivity of the glitch detection circuit of the invention corresponding to voltage changes with different slopes (voltage change/time) on the power supply terminal can be adjusted.

Although the invention is disclosed with the foregoing embodiments as above, it is not intended to limit the invention. Any person skilled in the arts can make some modifications and retouches without departing from the spirit and scope of the invention. The patent protection scope of the invention shall be determined by the scope of the patent application claims attached to the specification.

What is claimed is:

1. A glitch detection circuit, comprising:
a first P-type field effect transistor, comprising a source electrically coupling to a power supply terminal;
a first current source, providing a first bias current to the first P-type field effect transistor, wherein a terminal of the first current source is electrically coupled to a negative voltage terminal, and another terminal of the first current source is electrically coupled to a drain of the first P-type field effect transistor;
a second P-type field effect transistor, comprising a source electrically coupled to the power supply terminal, wherein a channel width-to-length ratio (W/L) of the first P-type field effect transistor is greater than a channel width-to-length ratio (W/L) of the second P-type field effect transistor;
a second current source, providing a second bias current to the second P-type field effect transistor, wherein a terminal of the second current source is electrically coupled to the negative voltage terminal, and another terminal of the second current source is electrically coupled to a drain of the second P-type field effect transistor;
a capacitor having a terminal electrically coupled to the negative voltage terminal, and other terminal electrically coupled to a gate of the first P-type field effect transistor and a gate of the second P-type field effect transistor, and the other terminal of the capacitor preserves at a predetermined voltage;
a determination circuit, wherein when a voltage decreasing amount of the drain of the first P-type field effect transistor is greater than a voltage decreasing amount of the drain of the second P-type field effect transistor, the determination circuit determines that the power supply terminal occurs a negative glitch, when the voltage increasing amount of the drain of the second P-type field effect transistor is greater than the voltage increasing amount of the drain of the first P-type field effect transistor, the determination circuit determines that the power supply terminal occurs a positive glitch.

2. The glitch detection circuit of the claim 1, wherein the voltage of the drain of the first P-type field effect transistor is higher than the voltage of the drain of the second P-type field effect transistor when the power supply terminal is under a normal state.

3. The glitch detection circuit of the claim 1, wherein the first current source and the second current source are implemented by a current mirror circuit, the current mirror circuit comprising:
a first N-type field effect transistor connected in series between the drain of the first P-type field effect transistor and the negative voltage terminal; and
a second N-type field effect transistor connected in series between the drain of the second P-type field effect transistor and the negative voltage terminal, wherein the channel width-to-length ratio (W/L) of the first N-type field effect transistor is equal to the channel width-to-length ratio (W/L) of the second N-type field effect transistor.

4. The glitch detection circuit of the claim 1, wherein the determination circuit comprises:
a first inverter, having an input terminal coupled to the drain of the first P-type field effect transistor; and
a second inverter, having an input terminal coupled to the drain of the second P-type field effect transistor, wherein when a voltage of an output terminal of the first inverter increases, the determination circuit determines that the power supply terminal occurs the negative glitch, when a voltage of an output terminal of the second inverter decreases, the determination circuit determines that the power supply terminal occurs the positive glitch.

5. The glitch detection circuit of the claim 1, wherein the determination circuit comprises:
a first comparator, configured to compare a voltage of the drain of the first P-type field effect transistor and a first reference voltage; and
a second comparator, configured to compare a voltage of the drain of the second P-type field effect transistor and a second reference voltage, when an output signal of the first comparator indicates that a voltage of the drain of first P-type field effect transistor is lower than the first reference voltage, the determination circuit determines that the power supply terminal occurs the negative glitch, when an output signal of the second comparator indicates that a voltage of the drain of second P-type field effect transistor is greater than the second reference voltage, the determination circuit determines that the power supply terminal occurs the positive glitch.

6. A glitch detection circuit, comprising:
a P-type field effect transistor, comprising a source electrically coupled to a power supply terminal;
a capacitor, having a terminal electrically coupled to a negative voltage terminal, and other terminal electrically coupled to a gate of the P-type field effect transistor, wherein said the other terminal of the capacitor preserves at a predetermined voltage;
a current mirror circuit, providing a first bias current to the P-type field effect transistor, and comprising an N-type field effect transistor, wherein the N-type field effect transistor is connected in series between a drain of the P-type field effect transistor and the negative voltage terminal, an on-resistance of the P-type field effect transistor is lower than an on-resistance of the N-type field effect transistor when the power supply terminal is under a normal state; and
a determination circuit, wherein when a voltage of the drain of the P-type field effect transistor decreases, the determination circuit determines that the power supply terminal occurs a negative glitch.

7. The glitch detection circuit of the claim 6, wherein the determination circuit comprises an inverter, an input terminal of the inverter is coupled to the drain of the P-type field effect transistor, and when a voltage of an output terminal of the inverter increases, the power supply terminal occurs the negative glitch.

8. A glitch detection circuit, comprising:
a P-type field effect transistor, comprising a source electrically coupled to a power supply terminal;
a capacitor, having a terminal electrically coupled to a negative voltage terminal, and other terminal electrically coupled to a gate of the P-type field effect transistor, wherein said the other terminal of the capacitor preserves at a predetermined voltage;
a current mirror circuit, providing a first bias current to the P-type field effect transistor, and comprising an N-type field effect transistor, wherein the N-type field effect transistor is connected in series between a drain of the P-type field effect transistor and the negative voltage terminal, and an on-resistance of the P-type field effect transistor is greater than an on-resistance of the N-type field effect transistor when the power supply terminal is under a normal state; and
a determination circuit, wherein when a voltage of the drain of the P-type field effect transistor increases, the determination circuit determines that the power supply terminal occurs a positive glitch.

9. The glitch detection circuit of the claim 8, wherein the determination circuit comprises an inverter having an input terminal coupled to the drain of the P-type field effect transistor, and when a voltage of an output terminal of the inverter decreases, the determination circuit determines that the power supply terminal occurs the positive glitch.

10. A glitch detection circuit, comprising:
a current mirror circuit, comprising:
a first N-type field effect transistor;
a second N-type field effect transistor;
a third N-type field effect transistor; and
a fourth N-type field effect transistor;
wherein sources of the first N-type field effect transistor, the second N-type field effect transistor, the third N-type field effect transistor and the fourth N-type field effect transistor are electrically coupled to a negative voltage terminal;
wherein gates of the first N-type field effect transistor, the second N-type field effect transistor, the third N-type field effect transistor and the fourth N-type field effect transistor are electrically coupled to the drain of the fourth N-type field effect transistor;
wherein the drain of the fourth N-type field effect transistor receives a reference current, and a first current flowing through the drain of the first N-type field effect transistor is mirrored from the reference current, and a second current flowing through the drain of the second N-type field effect transistor is mirrored from the reference current, and a third current flowing through the drain of the third N-type field effect transistor is mirrored from the reference current;
a first P-type field effect transistor, comprising a source electrically coupled to a power supply terminal, and a drain electrically coupled to the drain of the first N-type field effect transistor;
a second P-type field effect transistor, comprising a source electrically coupled to the power supply terminal, and a drain electrically coupled to the drain of the second N-type field effect transistor;
a third P-type field effect transistor, comprising a source electrically coupled to the power supply terminal, and a drain electrically coupled to the drain of the third N-type field effect transistor;
a capacitor, comprising a terminal electrically coupled to the negative voltage terminal, and other terminal electrically coupled to the gate of the first P-type field effect transistor, and the gate of the second P-type field effect transistor, and the gate and the drain of the third P-type field effect transistor; and
a determination circuit, wherein when a voltage decreasing amount of the drain of the first P-type field effect transistor is greater than a voltage decreasing amount of the drain of the second P-type field effect transistor, the determination circuit determines that the power supply terminal occurs a negative glitch, when a voltage increasing amount of the drain of the second P-type field effect transistor is greater than a voltage increasing amount of the drain of the first P-type field effect transistor, the determination circuit determines that the power supply terminal occurs a positive glitch.

\* \* \* \* \*